(12) United States Patent
Nakamura (10) Patent No.: US 9,665,448 B2
(45) Date of Patent: *May 30, 2017

(54) SEMICONDUCTOR INTEGRATED CIRCUIT

(71) Applicant: Renesas Electronics Corporation, Kawasaki, Kangawa (JP)

(72) Inventor: Koichi Nakamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 38 days.

This patent is subject to a terminal disclaimer.

(21) Appl. No.: 14/461,935

(22) Filed: Aug. 18, 2014

(65) Prior Publication Data

US 2014/0359403 A1   Dec. 4, 2014

Related U.S. Application Data

(63) Continuation of application No. 13/040,501, filed on Mar. 4, 2011, now Pat. No. 8,843,800.

(30) Foreign Application Priority Data

Mar. 8, 2010   (JP) ................. 2010-050785

(51) Int. Cl.
| | |
|---|---|
| *G06F 7/02* | (2006.01) |
| *G06F 11/18* | (2006.01) |
| *G06F 11/10* | (2006.01) |
| *H03M 13/05* | (2006.01) |
| *G06F 11/07* | (2006.01) |

(52) U.S. Cl.
CPC ........ *G06F 11/183* (2013.01); *G06F 11/0793* (2013.01); *G06F 11/10* (2013.01); *H03M 13/05* (2013.01)

(58) Field of Classification Search
CPC ................. G06F 11/1008; G06F 11/1497
See application file for complete search history.

(56) References Cited

U.S. PATENT DOCUMENTS

| 5,812,757 A | * | 9/1998 | Okamoto | ............ G06F 11/1658 |
|---|---|---|---|---|
| | | | | 714/11 |
| 6,646,464 B2 | * | 11/2003 | Maruyama | ........... H03K 3/0375 |
| | | | | 326/35 |

(Continued)

FOREIGN PATENT DOCUMENTS

| JP | 05-265872 A | 10/1993 |
|---|---|---|
| JP | 2002-185309 A | 6/2002 |
| JP | 2004-038468 A | 2/2004 |

*Primary Examiner* — M. Mujtaba Chaudry
(74) *Attorney, Agent, or Firm* — Foley & Lardner LLP (57) ABSTRACT

A semiconductor integrated circuit pertaining to the present invention comprises a plurality of storage elements for storing and holding an input signal, a majority circuit that outputs a result of a majority decision of outputs from the plurality of storage elements; an error detector circuit that detects a mismatch among the outputs of the plurality of storage elements and outputs error signals; and a monitor circuit that monitors the error signals from the error detector circuit, wherein the monitor circuit, based on the error signals, orders a refresh action that rewrites data for rectification to a storage element in which an output mismatch occurs out of the plurality of storage elements and, if rewrite and rectification by the refresh action are unsuccessful, sends a notification to an external unit or process.

5 Claims, 10 Drawing Sheets

(56) References Cited

U.S. PATENT DOCUMENTS

| | | | |
|---|---|---|---|
| 8,296,604 B1* | 10/2012 | Trimberger | G06F 11/1497 714/21 |
| 2003/0228857 A1* | 12/2003 | Maeki | H01Q 1/246 455/278.1 |
| 2009/0040934 A1* | 2/2009 | Matsubara | G05B 23/0237 370/242 |
| 2009/0193301 A1 | 7/2009 | Ito et al. | |
| 2010/0180150 A1 | 7/2010 | Jeddeloh | |
| 2010/0332949 A1 | 12/2010 | D'Abreu et al. | |
| 2011/0122716 A1* | 5/2011 | Pyo | G11C 11/406 365/200 |

* cited by examiner

SEMICONDUCTOR INTEGRATED CIRCUIT

CROSS-REFERENCE TO RELATED APPLICATIONS

This application is a continuation of U.S. application Ser. No. 13/040,501, filed Mar. 4, 2011, which claims benefit of priority from the prior Japanese Application No. 2010-50785, filed Mar. 8, 2010; the entire contents of all of which are incorporated herein by reference.

BACKGROUND

1. Field of the Invention

The present invention relates to a semiconductor integrated circuit and more particularly to a semiconductor integrated circuit equipped with a plurality of storage elements for storing and holding an input signal and a majority circuit that outputs a result of a majority decision of outputs from these storage elements.

2. Description of Related Art

Functional safety standard IEC 61508 (functional safety of electrical, electronic, and programmable electronic safety-related systems) was established in 2000. In Europe, it is obligated to obtain a functional safety certification on an ECU level with regard to a motor vehicle, inter alia, before obtaining a certification as the motor vehicle. This is for the purpose that a government is to verify in advance the conformity of a motor vehicle, inter alia, to the standard.

In the context as above, an MCU (Memory Control Unit) that performs control and management of a memory within a CPU (Central Processing Unit) is also required to support IEC 61508. Correspondingly, in order to fulfill the reliability enhancement and functional safety of registers provided in peripheral circuits in the MCU, there is a demand for enhancing the reliability of a signal that is used in a digital circuit using a majority circuit, inter alia.

One of the causes inducing a digital circuit malfunction is a soft error. When radiant rays (for example, alpha rays, neutron rays, etc.) intrude into a semiconductor integrated circuit, a reaction between a semiconductor substrate and the radiant rays generates charges and the thus generated charges building up in an output element of a logic circuit give rise to logic inversion; this kind of disorder is called the soft error. Unlike a hard error due to a physical fault such as a stuck-at fault in a circuit, the soft error is temporary and recovery to a normal state is possible by rewriting.

Figure 9:
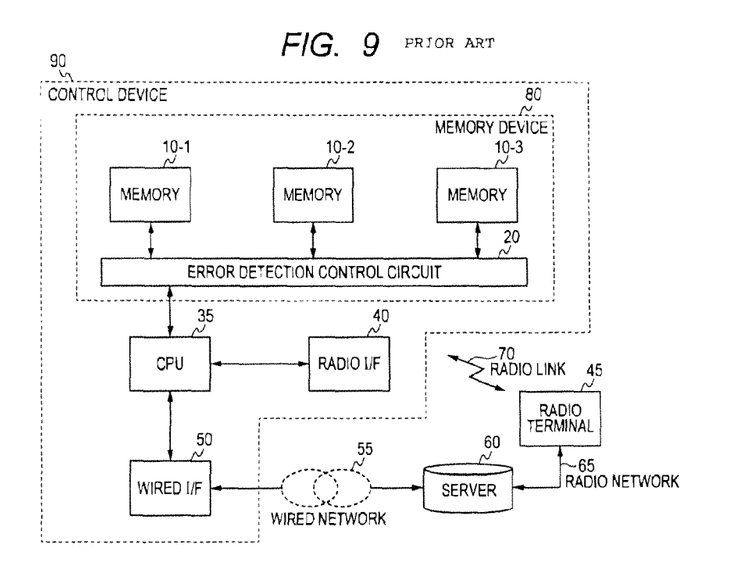
FIG. 9 is a block diagram showing configuration of a memory system with an automatic soft error rectification function disclosed in Japanese Application Publication No. 2004-38468.

A technique for making an automatic rectification of this soft error is disclosed in Japanese Application Publication No. 2004-38468. FIG. 9 is a block diagram showing a configuration of a memory system with an automatic soft error rectification function.

The memory system with an automatic soft error rectification function of Japanese Application Publication No. 2004-38468, as shown in FIG. 9, comprises: a control device 90 equipped with a memory device 80 storing and holding computer programs and data, a CPU 35 that accesses the memory device 80 and performs processing such as calculation, arithmetic operation, and control, a radio I/F (Interface) 40 coupled to the CPU 35, and a wired I/F 50 coupled to the CPU 35; and a server 60 that is an formation processing device holding computer programs and data and having a function capable of delivering any of these computer programs and data by request.

The memory device 80 provided in the control device 90 comprises a set of three memories 10 (10-1, 10-2, 10-3) that store and hold computer programs and data, wherein these programs and data can be read from and written into the memories 10, and an error detection control circuit 20 that reads data from and writes data into the memories 10 and performs detection and rectification of a fault such as a soft error occurred in the memories 10.

Figure 10:
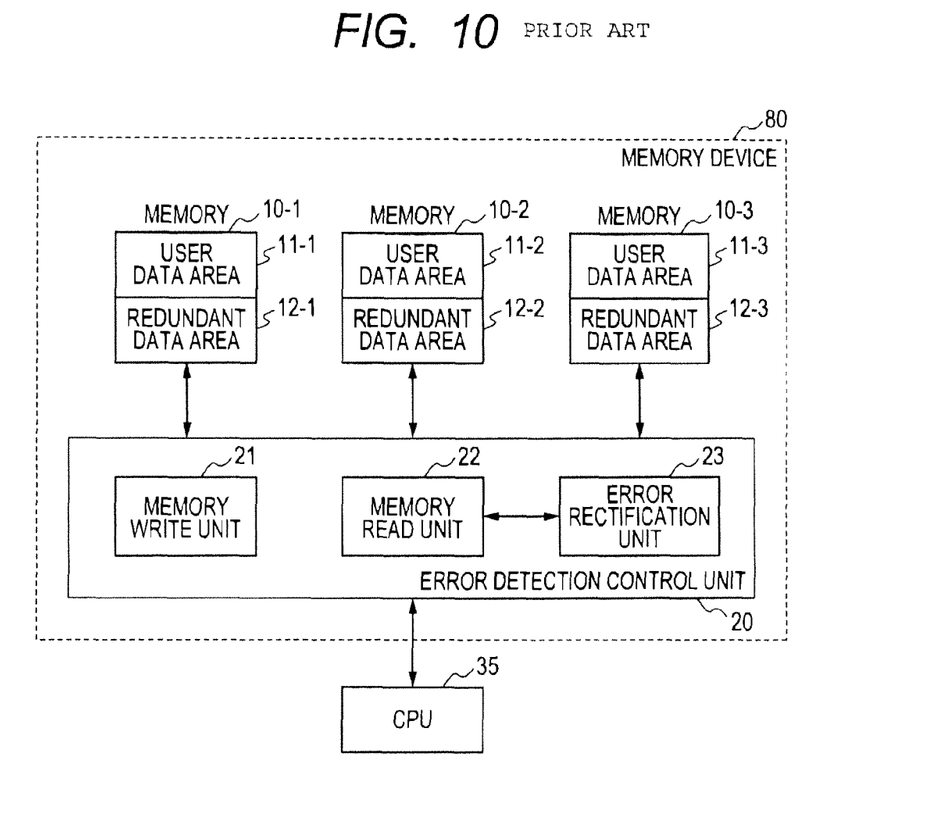
FIG. 10 is a detailed block diagram showing an example of a memory device 80 in FIG. 9.

FIG. 10 is a detailed block diagram showing an example of the memory device 80 in FIG. 9. In FIG. 10, components corresponding to those shown in FIG. 9 are assigned the same reference numbers or symbols.

In FIG. 10, first, each of the three memories 10 in the set is partitioned into a user data area 11 (11-1, 11-2, 11-3) and a redundant data area 12 (12-1, 12-2, 12-3). The user data area 11 is freely accessible to a user who uses the present memory device 80 and data can freely be read from and written into this area under control of the CPU 35. Depending on usage of the present memory device 80, data may be read and written in arbitrary units: for example, in units of bytes, words, or records (a unit of storage comprising a plurality of bytes or a plurality of words).

Then, as for the memory system with an automatic soft error rectification function shown in FIGS. 9 and 10, how it operates is stated explicitly below.

When writing data from a user who uses the memory device 80 into the memories 10, the CPU 35 of the control device 90 sends the memory device 80 a write request to write the data into a specified address in the memories 10. The write request may be issued to write data in arbitrary units of bytes, words, or records, depending on usage of the present memory device 80. The memory device 80 is adapted to generate redundant data in units of bytes in response to a write request for data in units of bytes, generate redundant data in units of words in response to a write request for data in units of words, and generate redundant data in units of words in response to a write request for data in units of records.

The memory device 80, once having received the write request for data, sends the write request to a memory write unit 21 of the error detection control circuit 20. The memory write unit 21 writes the write requested data into the specified address within the user data area 11-1 of the memory 10-1 and, moreover, automatically generates redundant data for the data and writes and stores the redundant data into a location corresponding to the specified address in the redundant data area 12-1. Then, it copies the data and the redundant data to locations corresponding the specified address in other two memories 10-2, 10-3, thus overwriting the previous data in these locations. Upon completion of writing the data into the three memories 10 (10-1, 10-2, 10-3), the memory write unit 21 makes sure of the consistency of the data stored and held in the three memories 10 and sends a data write complete notification to the CPU 35.

The CPU 35, once having received the data write complete notification, if next data to be written into the memories 10 exists, sends a write request for the next data to the memory device 80. Thereby, the memory device 80 performs the same operation as described above and stores and holds the same data in the three memories 10 (10-1, 10-2, 10-3).

Next, when reading data from the memories 10, the CPU 35 sends the memory device 80 a read request for data whose address in the memories 10 is specified.

The memory device 80, once having received the read request for the data, sends the read request to a memory read unit 22 of the error detection control circuit. The memory read unit 22 reads the read requested data from the specified address within the user data area 11-1 of the memory 10-1 and, moreover, reads redundant data for the data from a location corresponding to the specified address in the redundant data area 12-1. Then, it checks from the data and the redundant data whether or not a fault such as a soft error occurs in the data.

As a result of the check, if a fault such as a soft error is not detected in the data, the data read unit sends this data with a read complete notification to the CPU 35, because the data is free of error.

As a result of the check by the memory read unit 22, if a fault such as a soft error is detected in the data, the memory read unit 22 notifies an error rectification unit 23 of the address of the data.

The error rectification unit 23 reads the addressed data from the specified address within the user data area 11-2 of the memory 10-2, not the memory 10-1 from which the data has already been read, and, moreover, reads redundant data for the data from a location corresponding to the specified address in the redundant data area 12-2. Then, it checks from the data and the redundant data whether or not a fault such as a soft error occurs in the data. As a result of the check, if a fault is not detected in the data, the error rectification unit 23 sends the data, that is, the data read from the memory 10-2 to the memory read unit 22. The memory read unit 22 sends that data with a read complete notification to the CPU 35. Further, the error rectification unit 23 rectifies the data in error in the memory 10-1 by writing again the data and the redundant data read from the memory 10-2 into the user data area 11-1 and the redundant data area 12-1 of the memory 10-1.

If an error is detected from the memory 10-2 as well, when the error rectification unit 23 reads the memory 10-2, the error rectification unit 23 reads the addressed data from the specified address within the user data area 11-3 of the memory 10-3, not the memories 10-1, 10-2 from which the data has already been read, and, moreover, reads redundant data for the data from a location corresponding to the specified address in the redundant data area 12-3. Then, it checks from the data and the redundant data whether or not a fault such as a soft error occurs in the data. As a result of the check, if a fault is not detected in the data, the error rectification unit 23 sends the data, that is, the data read from the memory 10-3 to the memory read unit 22. The memory read unit 22 sends that data with a read complete notification to the CPU 35. Further, the error rectification unit 23 rectifies the data in error in the memories 10-1, 10-2 by writing again the data and the redundant data read from the memory 10-3 into the user data areas 11-1, 11-2 and the redundant data areas 12-1, 12-2 of the memories 10-1, 10-2.

If the error rectification unit 23 has detected an error from both the memory 10-2 and the memory 10-3, it notifies the memory read unit 22 that the error is not rectifiable, because it is impossible for the error rectification unit 23 to rectify the error. The memory read unit 22 sends the CPU 35 a notification that the error is not rectifiable with the address of data in error.

In a case that the CPU 35 has received the read complete notification from the memory read unit 22, the CPU 35 executes required processing using the data sent with the read complete notification, that is, the error-free data.

In a case that the CPU 35 has received the notification that the error is not rectifiable from the memory read unit the CPU 35 activates the wired I/F 50 and instructs it to transmit address information of the data in error to the server 60. The wired I/F 50 transmits this information to the server 60 via a wired network 55. The server 60 stores and logs the error occurred at the address in a history file and retrieves the addressed data from its own storage device that it maintains.

The server 60 delivers this addressed data via the wired network 55 and transmits it to the wired I/F 50. The wired I/F 50 sends the data delivered from the server 60 to the CPU 35.

From the wired I/F 50, once having received the data delivered from the server 60, the CPU 35 sends the memory device 80 a write request to write again the data into the specified address in the memories 10. The memory device 80 performs the same operation as it received a write request as normal, described above, and writes the data into the specified address in the memories 10 (three memories 10-1, 10-2, 10-3). Thereby, the addressed data will be rectified to error-free data as it was originally. Besides, it is possible further enhance the reliability of data rectification by sending again a query about the data rewritten into memories 10 under control of the CPU 35 to the server 60 via the wired I/F 50, requesting the server 60 to deliver the data again, and checking the validity of the data.

SUMMARY

As described above, the memory system with an automatic soft error rectification function of Japanese Application Publication No. 2004-38468 is an apparatus that includes the CPU and the memory device as a data storage unit. The memory device comprises a set of three memories that store and hold data, wherein data can be read from and written into the memories, and an error detection control circuit that reads data from and writes data into the memories and performs detection and rectification of a fault such as a soft error occurred in the memories.

However, in a rectification method when an error occurs, according to Japanese Application Publication No. 2004-38468, error rectification is performed only at timing when data is read from or written into the memories. Therefore, there is a problem in which monitoring for error occurrence at all times is impossible.

In a case where a mismatch between data and its redundant data occurs in each of the three memories, the CPU transmits a command to the server and obtains data to be rewritten from the server. After that, a step of writing the data again into the memories is necessary. Consequently, if a hard error has occurred in the three memories due to a physical factor, a mismatch between data and its redundant data always occurs in each memory and a loop of rewriting to the memories takes place. If an interrupt priority for the CPU is not set high, a command wait state occurs. Although an error, whenever occurred, is logged in a history file on the server, what factor causes the error cannot be determined.

A semiconductor integrated circuit pertaining to the present invention comprises a plurality of storage elements for storing and holding an input signal; a majority circuit that outputs a result of a majority decision of outputs from the plurality of storage elements; an error detector circuit that detects a mismatch among the outputs of the plurality of storage elements and outputs error signals; and a monitor circuit that monitors the error signals from the error detector circuit, wherein the monitor circuit, based on the error signals, orders a refresh action that rewrites data for rectification to a storage element in which an output mismatch occurs out of the plurality of storage elements and, if rewrite and rectification by the refresh action are unsuccessful, sends a notification to an external unit or process. Thereby, when an error is caused by a hard error, it is possible to prevent a refresh loop from occurring, without depending on CPU operation.

According to the present invention, it is possible to provide a semiconductor integrated circuit with enhanced reliability.

DETAILED DESCRIPTION OF THE PREFERRED EMBODIMENTS

Embodiments of the present invention will be described hereinafter with reference to the drawings. For clarity of explanation, the following descriptions and drawings may be briefed and simplified, where appropriate. For clarity of explanation, also, duplicated descriptions are omitted, as appropriate. In the drawings, corresponding components are marked with the same reference numbers and symbols and their descriptions may be omitted, where appropriate.

First Embodiment

Figure 1:
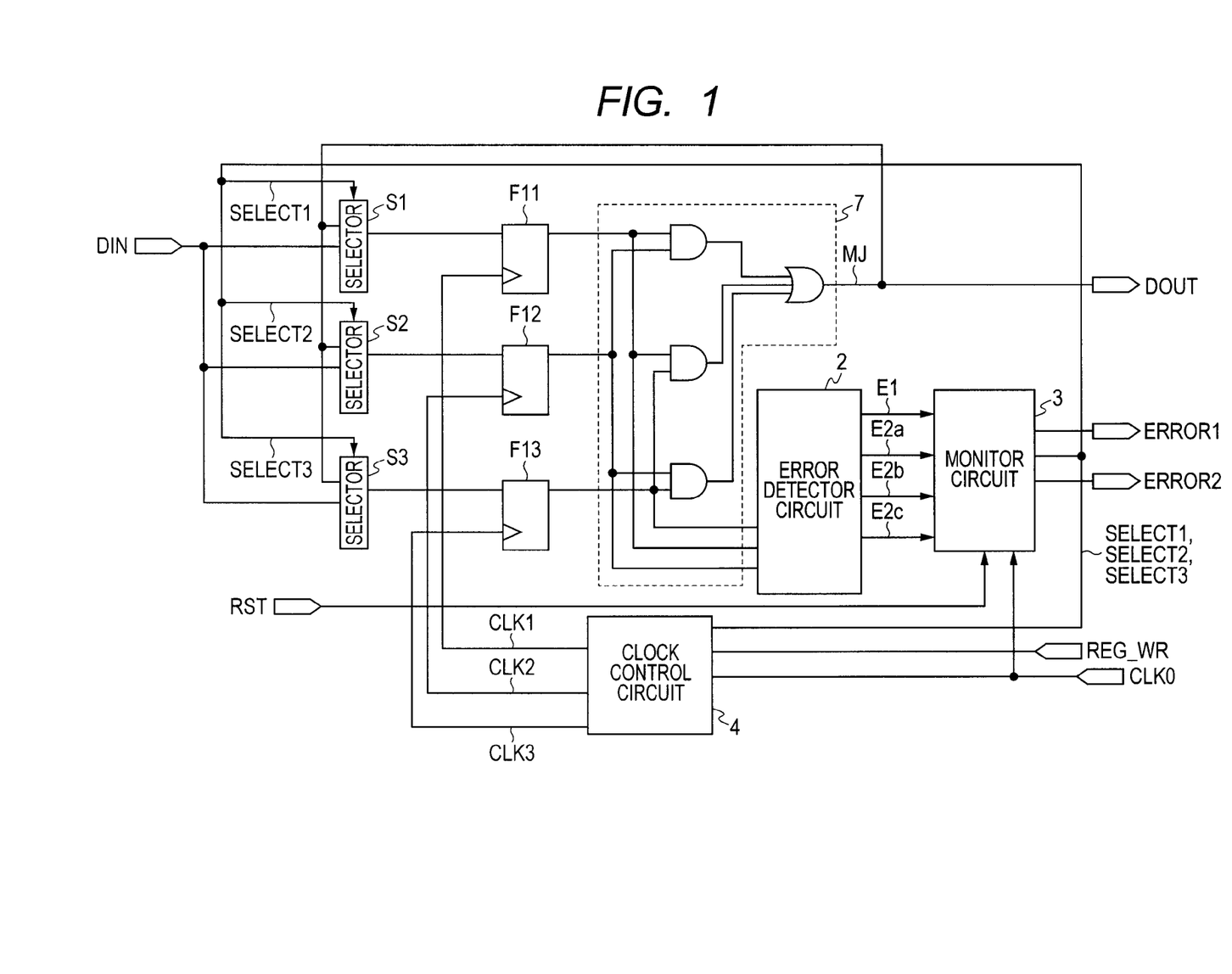
FIG. 1 is a block diagram showing an overall configuration of a semiconductor integrated circuit pertaining to a first embodiment.
Figure 2:
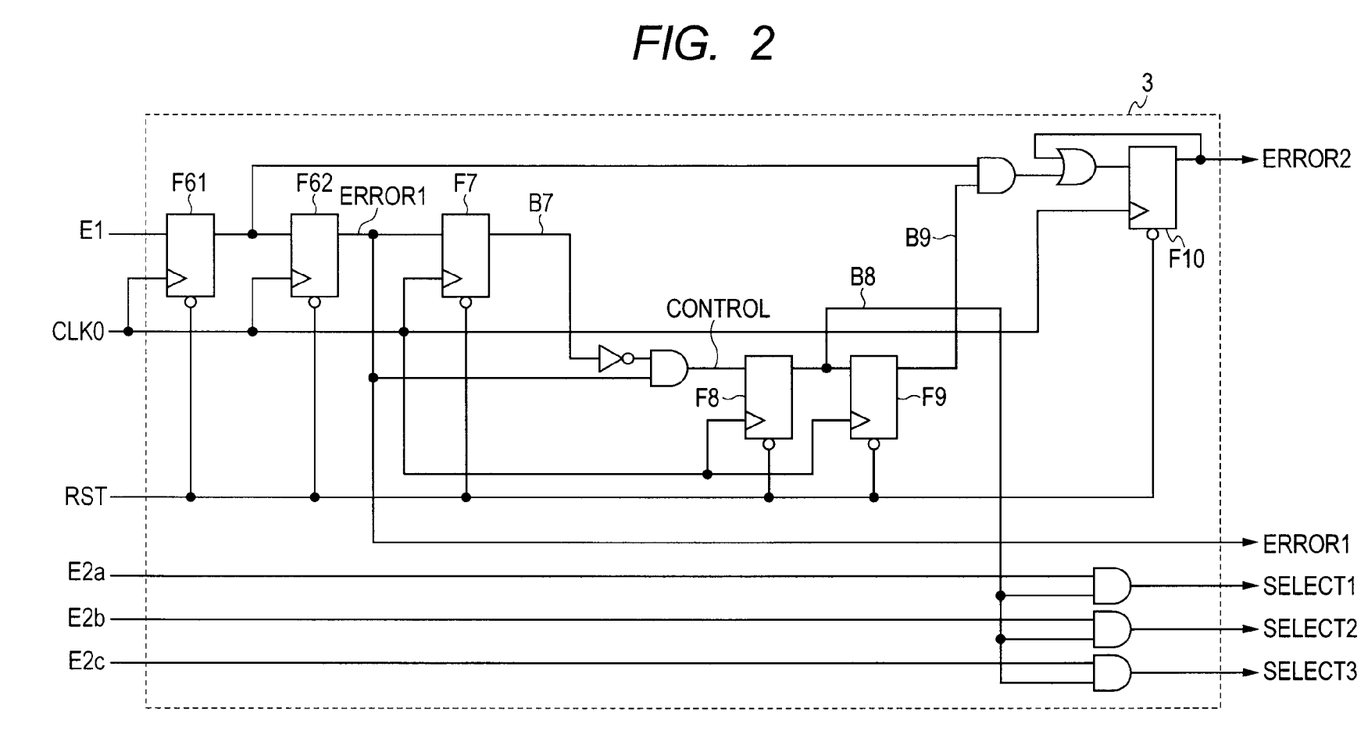
FIG. 2 is a circuit diagram showing an example of a monitor circuit that is used in the semiconductor integrated circuit pertaining to the first embodiment.
Figure 3:
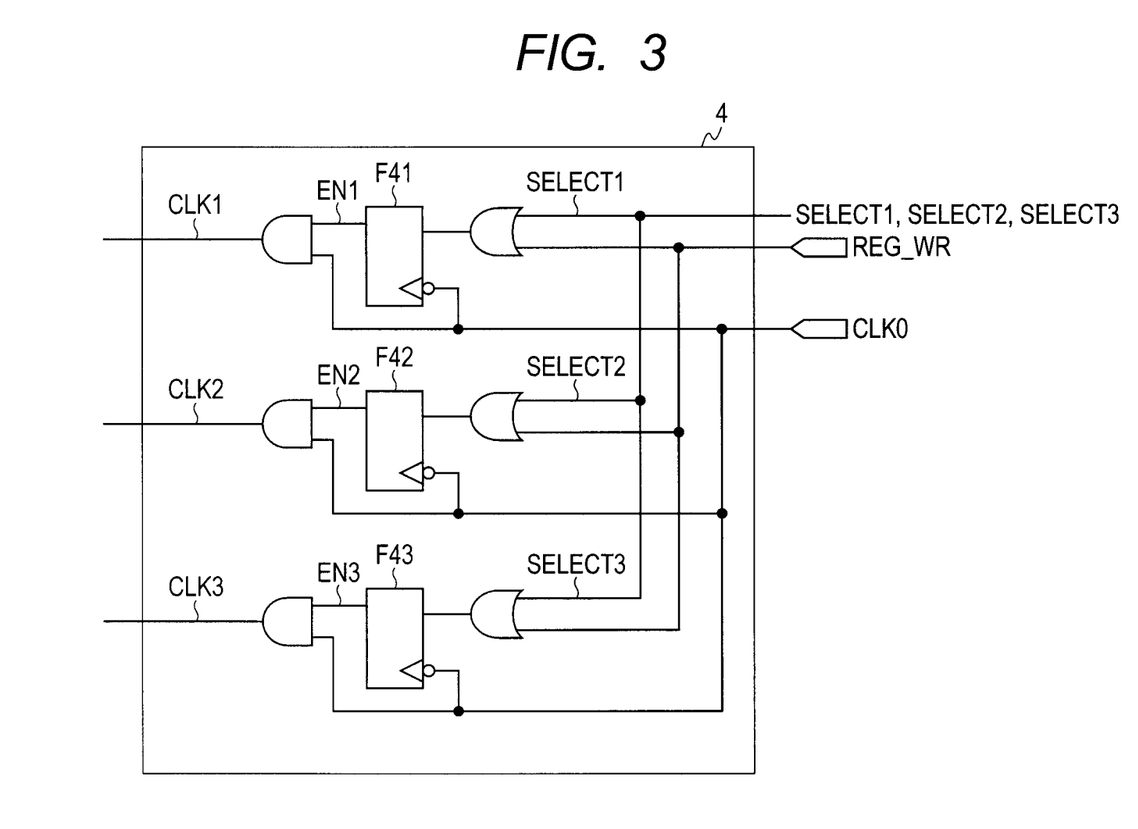
FIG. 3 is a circuit diagram showing an example of a clock control circuit that is used in the semiconductor integrated circuit pertaining to the first embodiment.

First, a configuration of a semiconductor integrated circuit pertaining to an embodiment disclosed herein is described, using FIGS. 1 thru 3. FIG. 1 is a block diagram showing an overall configuration of a semiconductor integrated circuit pertaining to a first embodiment. FIG. 2 is a circuit diagram showing an example of a monitor circuit that is used in the semiconductor integrated circuit pertaining to the first embodiment. FIG. 3 is a circuit diagram showing an example of a clock control circuit that is used in the semiconductor integrated circuit pertaining to the first embodiment.

The semiconductor integrated circuit pertaining to the first embodiment, as shown in FIG. 1, is equipped with three flip-flops F11, F12, F13, a majority circuit 7, an error detector circuit 2, a monitor circuit 3, a clock control circuit 4, and three selectors S1, S2, S3.

Respective input terminals of the flip-flops F11, F12, F13 (hereinafter may be referred to as a flip-flop F1 simply, where distinguishing one flip-flop from another is not needed) are coupled to respective output terminals of the selectors S1, S2, S3 (hereinafter may be referred to as a selector S simply, where distinguishing one selector from another is not needed). The flip-flops F11, F12, F13 serve as respective storage elements. The levels of output signals B1, B2, B3 of the selectors S1, S2, S3 are stored in the three flip-flops F11, F12, F13, respectively.

A flip-flop F11 causes a transition of an output signal B1 from a selector S1 in sync with a clock signal CLK1 which is input thereto and outputs the signal as an output signal B4. Likewise, a flip-flop F12 causes a transition of an output signal B2 from a selector S2 in sync with a clock signal CLK2 which is input thereto and outputs the signal as an output signal B5. Also, a flip-flop F13 causes a transition of an output signal B3 from a selector S3 in sync with a clock signal CLK3 which is input thereto and outputs the signal as an output signal B6.

Respective output terminals of the three flip-flops F11, F12, F13 are coupled to the majority circuit 7 and the error detector circuit 2. That is, the output signals B4, B5, B6 which are output from the flip-flops F11, F12, F13 are input to the majority circuit 7 and the error detector circuit 2.

The majority circuit 7 compares the output signals B4, B5, B6 one another and outputs data determined according to a majority decision logic as a majority decided result MJ. That is, the majority circuit 7 is a circuit that, if one of the three output signals B4, B5, B6 which are input thereto differs from others, outputs the remaining matched two data as the majority decided result MJ. Then, the majority decided result MJ of the majority circuit 7 is output as an output signal DOUT to an external unit or process outside the semiconductor integrated circuit.

Now, with regard to storage elements such as flip-flops, it is known that, when neutron rays hit against a well, a multi-error occurs in up to three adjacent cells because of a parasitic bipolar action (refer to IEICE (Institute of Electronics, Information and Communication Engineers) technical report ICD2003-24 "16.7 fA/cell Tunnel-Leakage Suppressed 16 Mb SRAM for Handling Cosmic-Ray-Induced Multi-Errors"). It turns out that, in order to avoid multi-errors, it is sufficient if separate wells are provided for each flip-flop or the flip-flops are spaced at intervals of at least three cells. Hence, in the first embodiment, in order to prevent data inversion for at least two of (more than one-half of) the three output signals B4, B5, B6 which are input to the majority circuit 7, the three flip-flops F11, F12, F13 are disposed in separate wells, respectively, or spaced at intervals of at least three cells. This can prevent a multi-error in which the three output signals B4, B5, B6 which are input to the majority circuit 7 are inverted at the same time by a soft error. That is, it is possible to prevent simultaneous data inversion by a soft error for more than one-half of the output signals B4, B5, B6 from the flip-flops F11, F12, F13, which are input to the majority circuit 7. Thus, the output of the majority circuit 7 can be maintained at a correct value at all times.

The error detector circuit 2 is a circuit that signals an error occurrence and which flip-flop in which the error originated by detecting a mismatch among the outputs of the three flip-flops F11, F12, F13. The error detector circuit 2 always monitors the output signals B4, B5, B6 from the flip-flops F11, F12, F13, which are input to the majority circuit 7, and determines whether or not these signals match. That is, the error detector circuit 2 determines whether or not any of the output signals B4, B5, B6 differs from others, as an error occurs in any of the three flip-flops F11, F12, F13, and outputs an error signal E1, depending on a result of the determination. In addition, the error detector circuit 2 outputs error signals E2a, E2b, E2c, one of which is "high" corresponding to the flip-flop in which the error originated.

Specifically, when the error detector circuit 2 detects that a mismatch occurs among the output signals B4, B5, B6, it makes the error signal E1 "high". At this time, if only the output signal B4 differs from other (that is, the output signal B4 does not match the output signals B5, B6), the error detector circuit 2 makes an error signal E2a "high". Likewise, if only the output signal B5 differs from other (that is, the output signal B5 does not match the output signals B4, B6), the error detector circuit 2 makes an error signal E2b "high". If only the output signal B6 differs from other (that is, the output signal B6 does not match the output signals B4, B5), the error detector circuit 2 makes an error signal E2c "high".

Therefore, if the output signals B4, B5, B6 from the three flip-flops F11, F12, F13 match, the error signals E1, E2a, E2b, E2c which are output from the error detector circuit 2 are "low". If an error occurs and there is a mismatch among the output signals B4, B5, B6 from the three flip-flops F11, F12, F13, the error signal E1 becomes "high" and, moreover, one of the error signals E2a, E2b, E2c becomes "high", corresponding to the flip-flop in which the error originated. This error detector circuit 2 can be configured only with, for example, a combinational circuit.

The error signals E1, E2a, E2b, E2c which are output from the error detector circuit 2 are input to the monitor circuit 3. The monitor circuit 3 monitors the error signals E2a, E2b, E2c which are the outputs of the error detector circuit 2 and, based on these signals, generates error notification signals ERROR1, ERROR2, and select signals SELECT1, SELECT2, SELECT3. The monitor circuit 3 orders a refresh action that rewrites data for rectification to the flip-flop in which an output mismatch occurs and, if rewrite and rectification to a correct value by the refresh action are unsuccessful, sends a notification to an external unit or process.

Specifically, if the monitor circuit 3 detects the error signal E1 indicating that one of the output signals B4, B5, B6 differs from other, it makes an error notification signal ERROR1 "high", as it has detected an error. That is, the error notification signal ERROR1 becomes "high", once the monitor circuit 3 has detected that one of the output signals B4, B5, B6 of the three flip-flops F11, F12, F13, which are used in the majority circuit 7, differs from others. Further, the monitor circuit outputs select signals SELECT1, SELECT2, SELECT3 (hereinafter may be referred to as a select signal SELECT simply, where distinguishing one select signal from another is not needed) to cause the flip-flop in which the error originated to perform the refresh action that rewrites data for rectification to a correct value, depending on the error signals E2a, E2b, E2c which are input thereto.

If the flip-flop F1 in which the error originated is rewritten and rectified to a collect value by the refresh action, the monitor circuit 3 determines that the cause of the error was a soft error and makes the error notification signal ERROR1 "low". If, in the flip-flop F1 in which the error originated, the rewrite and rectification to a correct value by the refresh action are unsuccessful, the monitor circuit 3 determines that the cause of the error is a hard error and makes the error notification signal ERROR2 "high". In this way, the monitor circuit 3 determines whether a soft error or a hard error causes the error by performing error detection again after the refresh action.

That is, if there is a mismatch among the output signals B4, B5, B6 of the flip-flops F11, F12, F13, the monitor circuit 3 performs error diction twice successively. The monitor circuit 3 determines the cause of the error, based on the number of times it detected the error signal E1 from the error detector circuit 2. If the monitor circuit has detected an error at error detection of the first time, the error notification signal ERROR1 being "high" and the error notification signal ERROR2 being "low" are output. If the monitor circuit has detected an error again at error detection of the second time, the error notification signal ERROR1 being "high" and the error notification signal ERROR2 being "high" are output. The error notification signals ERROR1, ERROR2 are signals that are output to an external unit or process from the semiconductor integrated circuit. To the monitor circuit 3, a reset signal RST and an input clock CL which are input from an external unit or process are to be input.

The monitor circuit 3, for example, as shown in FIG. 2, is configured including flip-flops F61, F62, F7, F8, F9, F10. Flip-flops F61, F62 are used for the purpose of synchronization of the error signal E1 which is asynchronous signal. The error signal E1 is input to a flip-flop F61 and an output signal from the flip-flop F61 is input to a flip-flop F62. Output of the flip-flop F62 notifies an external unit or process that a soft error has occurred, as the error notification signal ERROR1. A flip-flop F7 outputs an output signal B7, based on the error notification signal ERROR1 which is output from the flip-flop F62.

A flip-flop F8 generates timing as an output signal B8 for inputting a clock signal to the flip-flop to be rectified, when executing a refresh action of the flip-flop in which the error originated. The flip-flop F8 outputs the output signal B8, based on the error notification signal ERROR1 from the flip-flop F62 and a control signal CONTROL which is generated from the output signal B7 from the flip-flop F7. Based on this output signal B8 and the error signals E2a, E2b, E2c which are input from the error detector circuit 2, any of the select signals SELECT1, SELECT2, SELECT3 becomes "high".

A flip-flop F9 generates a refresh decision timing signal B9 which becomes active after a refresh action. The flip-flop F9 generates the refresh decision timing signal B9, based on the output signal B8 from the flip-flop F8. A flip-flop 10 generates the error notification signal ERROR2 due to a hard error. If the refresh decision timing signal B9 is "high" and the error signal E1 is "high", the flip-flop 10 determines that a physical source of the error exists, because of unsuccessful rectification of the flip-flop in which the error originated, and outputs the error notification signal ERROR2 to an external unit or process.

By means of the above configuration, the monitor circuit 3 controls a refresh action against an error detected by the error detector circuit 2 and sends a notification to an external unit or process. In this regard, initial values of the respective signals are as follows: error notification signal ERROR1 is "low", error notification signal ERROR2 is "low", select signal SELECT1 is "low", select signal SELECT2 is "low", and select signal SELECT3 is "low".

The select signals SELECT which are output from the monitor circuit 3 are input to the selectors S and the clock control circuit 4. These select signals SELECT are used as a select signal to cause the flip-flop in which the error originated to perform the fresh action that rewrites data for rectification to a correct value. The select signals SELECT are also used as a clock input enable signal, when executing the refresh action.

To the selectors S, the select signals from the monitor circuit, an input signal DIN from an external unit or process, and a majority decided result MJ from the majority circuit 7 are input. The input signal DIN is an input signal which is input from an external unit or process in order to write a value into the flip-flops F1. The selectors S select and output either the input signal DIN or the majority decided result MJ, depending on the select signals SELECT which are input thereto. The selectors S switch over to control to input the majority decided result MJ of the majority circuit 7 to the flip-flop in which the error originated when executing the refresh action.

In particular, a selector S1 outputs the input signal DIN as an output signal B1, when the select signal SELECT1 is "low", and outputs the majority decided result MJ as the output signal B1, when the select signal SELECT1 is "high". Likewise, a selector S2 outputs the input signal DIN as an output signal B2, when the select signal SELECT2 is "low", and outputs the majority decided result MJ as the output signal B2, when the select signal SELECT2 is "high". A selector S3 outputs the input signal DIN as an output signal B3, when the select signal SELECT3 is "low", and outputs the majority decided result MJ as the output signal B3, when the select signal SELECT3 is "high".

The clock control circuit 4 implements clock control for writing/rewriting of the three flip-flops F11, F12, F13. The clock control circuit 4 generates clock signals CLK1, CLK2, CLK3, based on the select signals SELECT which are input from the monitor circuit 3, a write enable signal REG_WR which is input from an external unit or process, and an input clock CLK0 which is input from an external unit or process. The write enable signal REG_WR is a signal to enable writing to the three flip-flops F11, F12, F13.

The clock control circuit 4, for example, as shown in FIG. 3, includes three flip-flops F41, F42, F43. A flip-flop F41 outputs an enable signal EN1 in sync with the input clock CLK which is input thereto, when the select signal SELECT1 or the write enable signal REG_WR is input. Based on this enable signal EN1, a clock signal CLK1 which is synchronous with the input clock CLK0 is generated.

Likewise, a flip-flop F42 outputs an enable signal EN2 in sync with the input clock CLK which is input thereto, when the select signal SELECT2 or the write enable signal REG_WR is input. Based on this enable signal EN2, a clock signal CLK2 which is synchronous with the input clock CLK0 is generated. A flip-flop F43 outputs an enable signal EN3 in sync with the input clock CLK which is input thereto, when the select signal SELECTS or the write enable signal REG_WR is input. Based on this enable signal EN3, a clock signal CLK3 which is synchronous with the input clock CLK0 is generated.

Figure 4:
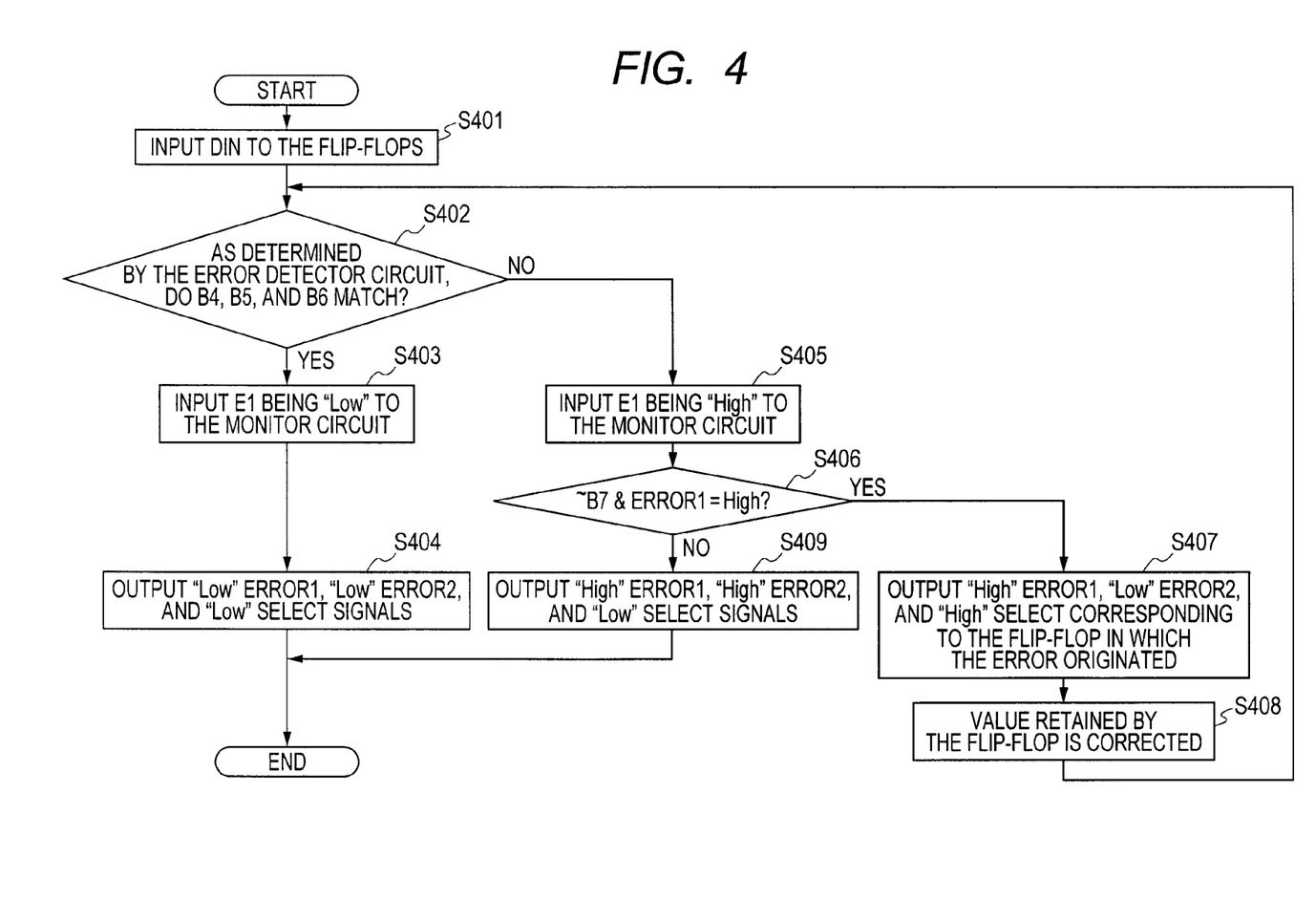
FIG. 4 is a flowchart describing a flow of an error detection method of the semiconductor integrated circuit pertaining to the first embodiment.

As for the semiconductor integrated circuit configured as described above, then, how it operates is described using FIG. 4. FIG. 4 is a flowchart describing a flow of an error detection method of the semiconductor integrated circuit pertaining to the first embodiment.

First, in an initial state, the select signals SELECT1, SELECT2, SELECT3 which are input to the selectors S1, S2, S3 are "low". In this sate, the input signal DIN is selected and output as the output signals B1, B2, B3 from the selectors S1, S2, S3. When writing the input signal DIN to the three flip-flops F11, F12, F13, the write enable signal REG_WR is made "high" by CPU access and the clock signals CLK1, CLK2, CLK3 are output from the clock control circuit 4.

To the flip-flops F11, F12, F13 to which the clock signals CLK1, CLK2, CLK3 have been input beforehand, the output signals B1, B2, B3 from the selectors S1, S2, S3 are input and the level of the input signal DIN is stored therein. In this way, the input signal DIN is input to the three flip-flops F11, F12, F13, respectively (step S401). When the output signals B4, B5, B6 from the flip-flops F11, F12, F13 are input to the majority circuit 7, the majority circuit 7 outputs a majority decided result MJ of these signals. This majority decided result MJ is output to an external unit or process as an output signal DOUT. By writing the same data into the three flip-flops F1 and taking a majority decision as above, even if any data is lost, the original data can be read correctly.

When the output signals B4, B5, B6 from the flip-flops F11, F12, F13 are input to the error detector circuit 2, the error detector circuit 2 determines whether or not the output signals B4, B5, B6 match (step S402). As a result of the determination, if the output signals B4, B5, B6 match, the error detector circuit 2 inputs an error signal E1 being "low" to the monitor circuit 3 (step S403). Upon receiving this input, the monitor circuit 3 determines that no error occurs in the flip-flops F11, F12, F13 and outputs error notification signals "low" ERROR1, "low" ERROR2, and "low" select signals, SELECT1, SELECT2, SELECT3 (step S404).

As a result of the determination in step S402, if a mismatch occurs among the output signals B4, B5, 136, the error detector circuit 2 inputs an error signal E1 being "high" to the monitor circuit 3 (step S405). In addition, the error detector circuit 2 makes any of the error signals E2a, E2b, E2c "high", which corresponds to the mismatched output signal, and inputs these error signals to the monitor circuit 3. The monitor circuit 3 performs error detection, based on these signals. Here, error detection is performed by, for example, determining whether or not both the negation of an output signal B7 generated based on the error signal E1 and the error notification signal ERROR1 are "high" (step S406).

In the error detection in step S406, a first-time determination by the monitor circuit 3 is assumed to be "Yes". So, the monitor circuit 3 determines that an error occurs in the flip-flops F11, F12, F13 and outputs error notification signals "high" ERROR1, "low" ERROR2, and any select signal SELECT being "high" which corresponds to the flip-flop in which the error originated (step S407).

This select signal triggers a refresh action and the value retained by the flip-flop in which the error originated is corrected (step S408). Specifically, the clock control circuit outputs any of the clock signals CLK1, CLK2, CLK3 corresponding to the select signal SELECT that is input from the monitor circuit 3. A selector S, one of the three selectors S, to which a "high" select signal SELECT was input from the monitor circuit switches over the output to its associated flip-flop F1 to the majority decided result MJ from the majority circuit 7. In this way, rewriting data into the flip-flop in which the error originated is performed.

After the refresh action, step S402 is executed again to check if the flip-flop F1 in which the error originated is rewritten and rectified to a correct value.

If the flip-flop F1 in which the error originated is rewritten and rectified to a correct value by the refresh action, a "Yes" determination is made in step S402. So, at step S403, the error detector circuit 2 inputs an error signal E1 being "low" to the monitor circuit 3. After that, at step S404, the monitor circuit 3 determines that no error occurs in the flip-flop F1 and outputs error notification signals "low" ERROR1, "low" ERROR2, and "low" select signals, SELECT1, SELECT2, SELECT3.

Otherwise, if, in the flip-flop F1 in which the error originated, the rewrite and rectification to a correct value by the refresh action are unsuccessful, a "No" determination is made in step S402. Then, at step 405, the error detector circuit 2 inputs an error signal E1 being "high" to the monitor circuit 3. After that, at step S406, it is determined again whether or not both the negation of the output signal B7 and the error notification signal ERROR1 are "high". That is, the monitor circuit 3 performs error detection again, based on the signal which is input from the error detector circuit 2.

In the error detection in step S406, a second-time determination by the monitor circuit 3 is assumed to be "No". Then, the monitor circuit 3 determines that a hard error occurs in any of the flip-flops F11, F12, F13 and outputs error notification signals "high" ERROR1 , "high" ERROR2, and "low" select signals, SELECT1, SELECT2, SELECT3 (step S409). In this way, the error notification signal ERROR2 being "high" is output and the refresh action can be deactivated, based on this signal.

Figure 5:
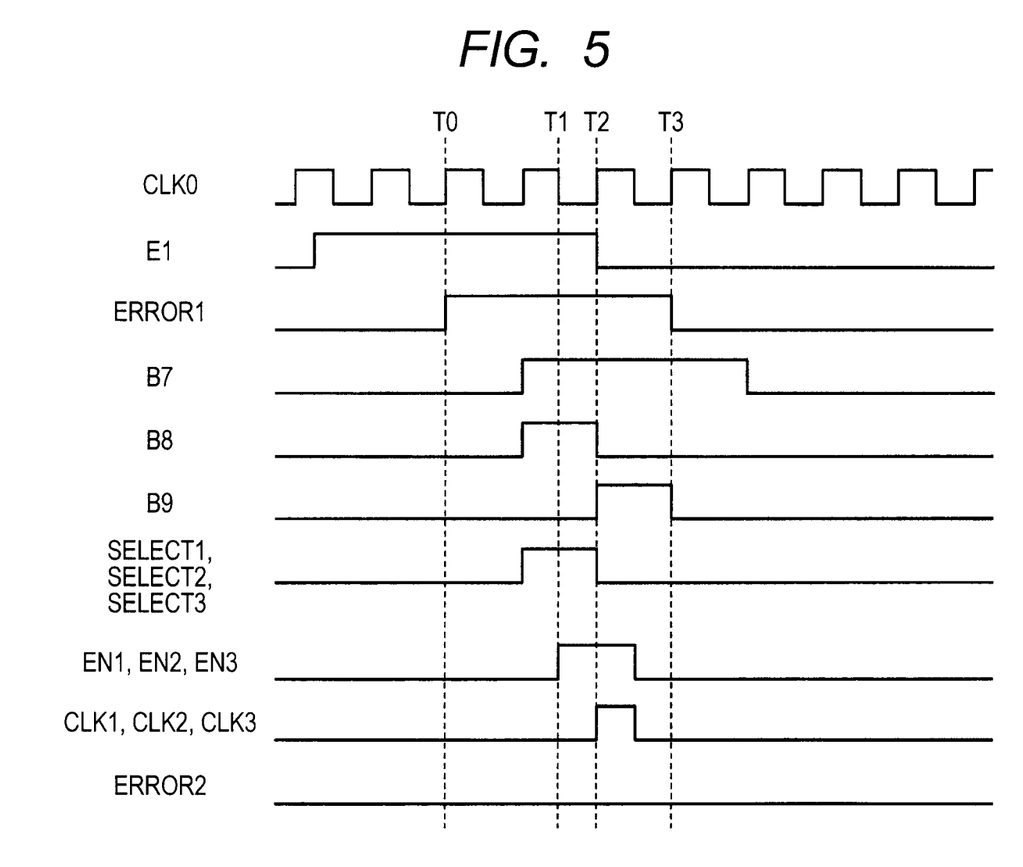
FIG. 5 is a timing chart of the semiconductor integrated circuit pertaining to the first embodiment.
Figure 6:
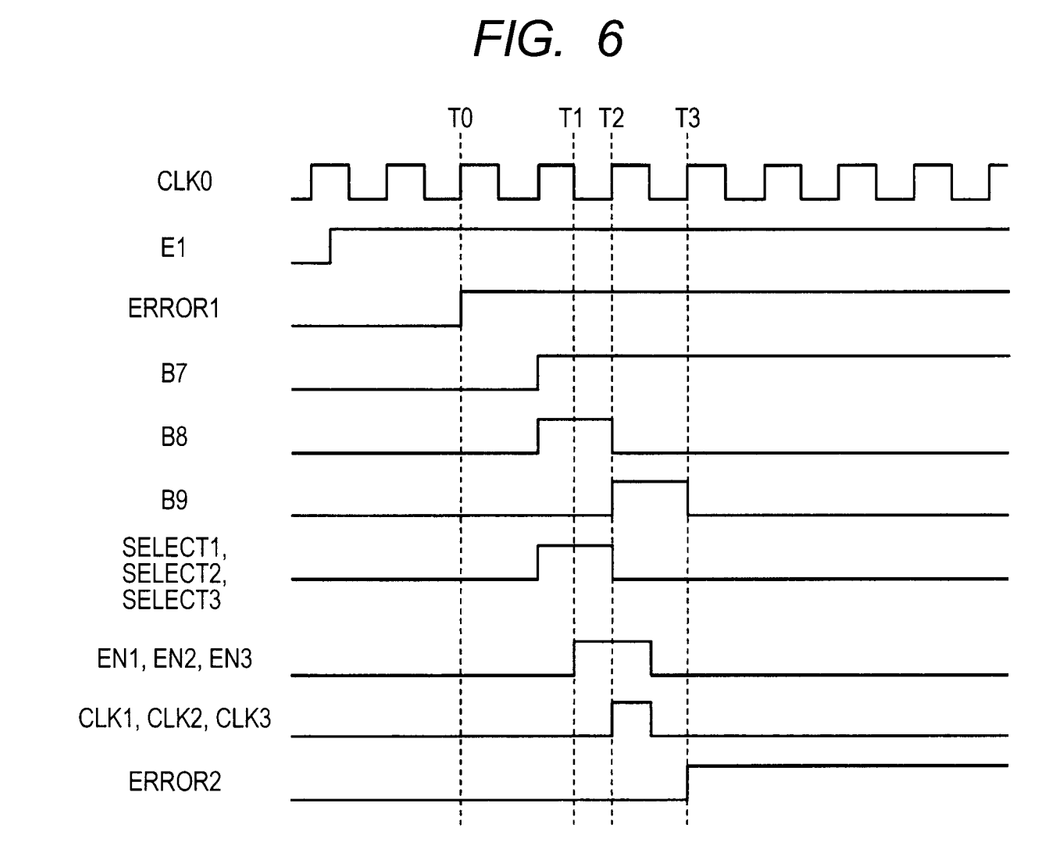
FIG. 6 is a timing chart of the semiconductor integrated circuit pertaining to the first embodiment.

FIG. 5 and FIG. 6 are timing charts of the semiconductor integrated circuit pertaining to the first embodiment. FIG. 5 represents an operation when the flip-flop in which the error originated has been rectified to a correct value by the refresh action. FIG. 6 represents an operation when the flip-flop in which the error originated cannot be rectified to a correct value by the refresh action.

In either case of the operations represented in FIG. 5 and FIG. 6, first, at step S401, the input signal DIN is input to the three flip-flops F11, F12, F13, respectively. Then, at step S402, the error detector circuit 2 determines whether or not the output signals B4, B5, B6 match. This step S402 takes place at time T0. Next, at step S405, an error signal E1 being "high" is input to the monitor circuit. In error detection by the monitor circuit 3 in step S406, a "Yes" determination is made and step S407 is executed. This step S407 takes place at time T1. After that, at step S408, a refresh action to refresh the flip-flop F1 in which the error originated is performed. This step S408 takes place at time T2. Thereby, the error notification signal ERROR1 becomes "high" and the error notification signal ERROR2 becomes "low", which are output from the monitor circuit 3.

Then, at step S402 again, the error detector circuit 2 determines whether or not the output signals B4, B5, B6 match. This second-time step S402 takes place at time T3. Here, in the operation as represented in FIG. 5, the flip-flop in which the error originated is assumed to be rectified to a correct value. So, the error signal E1 from the error detector circuit 2 changes from "high" to "low". Consequently, at step S403, the error signal E1 being "low" is input to the monitor circuit 3, and step S404 is executed. Thereby, the error notification signal ERROR1 becomes "low" and the error notification signal ERROR2 becomes "low", which are output from the monitor circuit 3.

On the other hand, in the operation as represented in FIG. 6, it is assumed that the flip-flop in which the error originated cannot be rectified to a correct value by the refresh action and a state that one of the output signals B4, B5, B6 differs from others continues and, therefore, the error signal E1 from the error detector circuit 2 remains "high". Consequently, at step S405, the error signal E1 being "high" is input to the monitor circuit 3. In error detection by the monitor circuit 3 in step S406, a "No" determination is made and step S409 is executed. Thereby, the error notification signal ERROR1 becomes "high" and the error notification signal ERROR2 becomes "high", which are output from the monitor circuit 3.

As above, in the present embodiment, a mismatch among the outputs of the three flip-flops F1, which are input to the majority circuit 7, is detected by the error detector circuit 2. In the case that a mismatch among the outputs occurs, the mismatch occurring is signaled to the monitor circuit 3 and a refresh action to rewrite data for rectification to a collect value is performed. If the rewrite and rectification to a correct value are done by the refresh action, the monitor circuit 3 determines that the error occurred was a soft error. If the rewrite and rectification to a correct value by the refresh action are unsuccessful, the monitor circuit determines that the error occurred is a hard error and sends a notification to an external unit or process. Thereby, what factor causing the error can be identified by the monitor circuit 3 and the refresh action can be deactivated, based on this information. In this way, in the present embodiment, when an error is caused by a hard error, is possible to prevent a refresh loop (rewrite loop) from occurring, without depending on CPU operation.

Moreover, the outputs of the three flip-flops F1 which are input to the majority circuit 7, are always monitored by the error detector circuit 2. This enables monitoring for every error occurrence and rectifying a soft error occurred at all times. Furthermore, the three flip-flops F1 are disposed in separate wells, respectively, or spaced at intervals of at least three cells. This can prevent a multi-error in which the three output signals B4, B5, B6 which are input to the majority circuit 7 invert at the same time. Hence, the output of the majority circuit 7 can be maintained at a correct value at all times. From the foregoing, according to the present embodiment, it is thus possible to provide a semiconductor integrated circuit with enhanced reliability and its associated error detection method.

Second Embodiment

Figure 7:
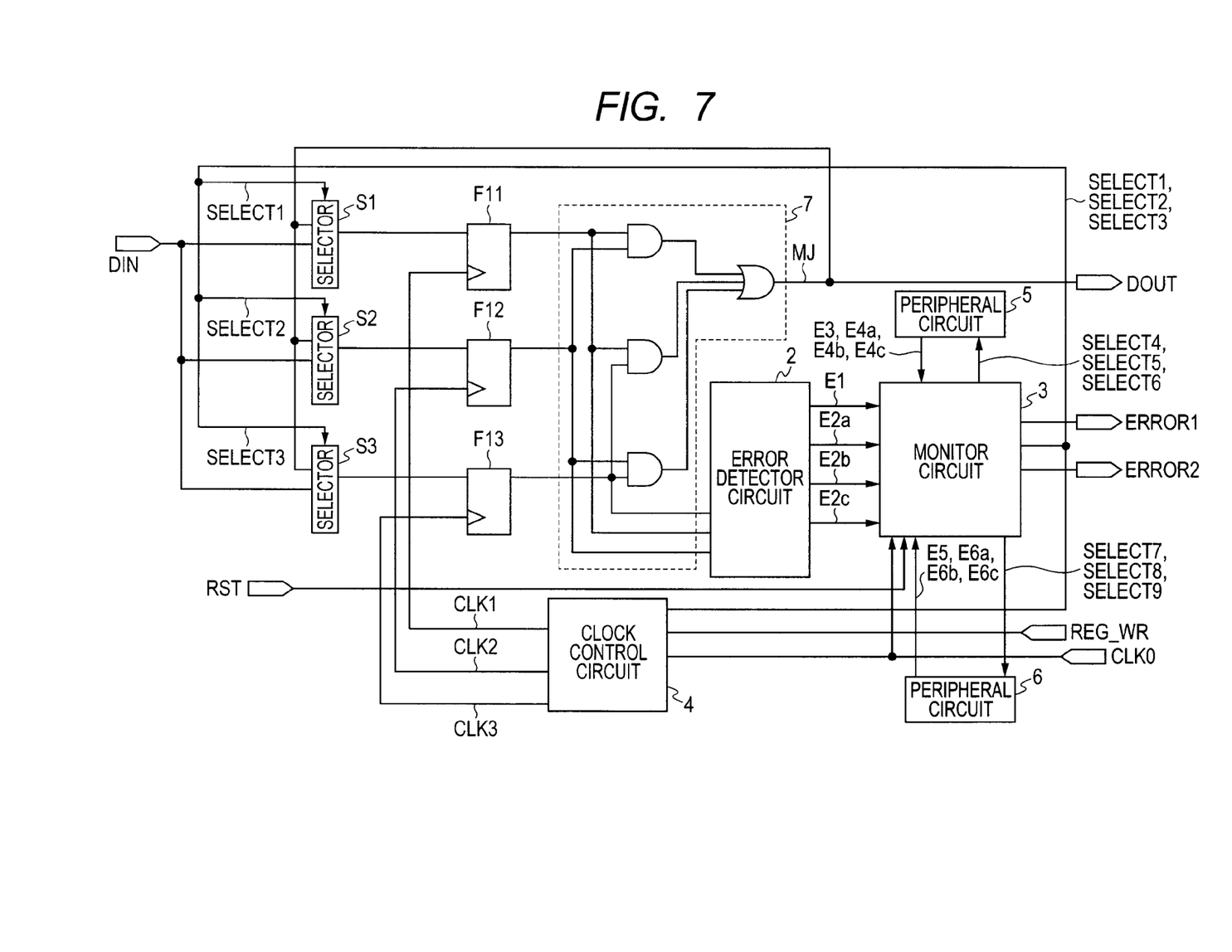
FIG. 7 is a block diagram showing an overall configuration of a semiconductor integrated circuit pertaining to a second embodiment.

A configuration of a semiconductor integrated circuit pertaining to a second embodiment, using FIG. 7. FIG. 7 is a block diagram showing an overall configuration of a semiconductor integrated circuit pertaining to the second embodiment. While the first embodiment has been described with regard to a case where the monitor circuit 3 monitors the outputs from the flip-flops, which are input to one majority circuit 7, the semiconductor integrated circuit in the second embodiment is adapted to monitor the outputs from the flip-flops, which are input to a plurality of majority circuits, at the same time.

In FIG. 7, the monitor circuit 3 of the second embodiment is configured such that error signals from error detector circuits 2 in other peripheral circuits 5, 6 are additionally input to the monitor circuit 3 of the first embedment. In particular, error signals E3, E4a, E4b, E4c from an error detector circuit 2, not shown, in a peripheral circuit 5 and error signals E5, E6a, E6b, E6c from an error detector circuit 2, not shown, in a peripheral circuit 6 are input to the monitor circuit 3. From the monitor circuit 3, select signals SELECT4, SELECT5, SELECT6 are input to the peripheral circuit 5 and select signals SELECT7, SELECT8, SELECT9 are input to the peripheral circuit 6.

Based on the error signals from a plurality of error detector circuits 2, the monitor circuit 3 orders a refresh action that rewrites data for rectification to the flip-flop in which an output mismatch occurs, and if the rewrite and rectification to a correct value by the refresh action are unsuccessful, sends a notification to an external unit or process. That is, with one monitor circuit 3, it is possible to monitor whether or not one of the input signals differs from others even for input signals to majority circuits 7 for use in other peripheral circuits 5, 6 within the MCU. Other configuration details are the same as in the first embodiment and, therefore, their descriptions are omitted. Although two peripheral circuits 5, 6 are only shown in FIG. 7, the number of peripheral circuits is not limited to two. That is, it is possible to accept a plurality of peripheral circuits using respective majority circuits 7.

Figure 8:
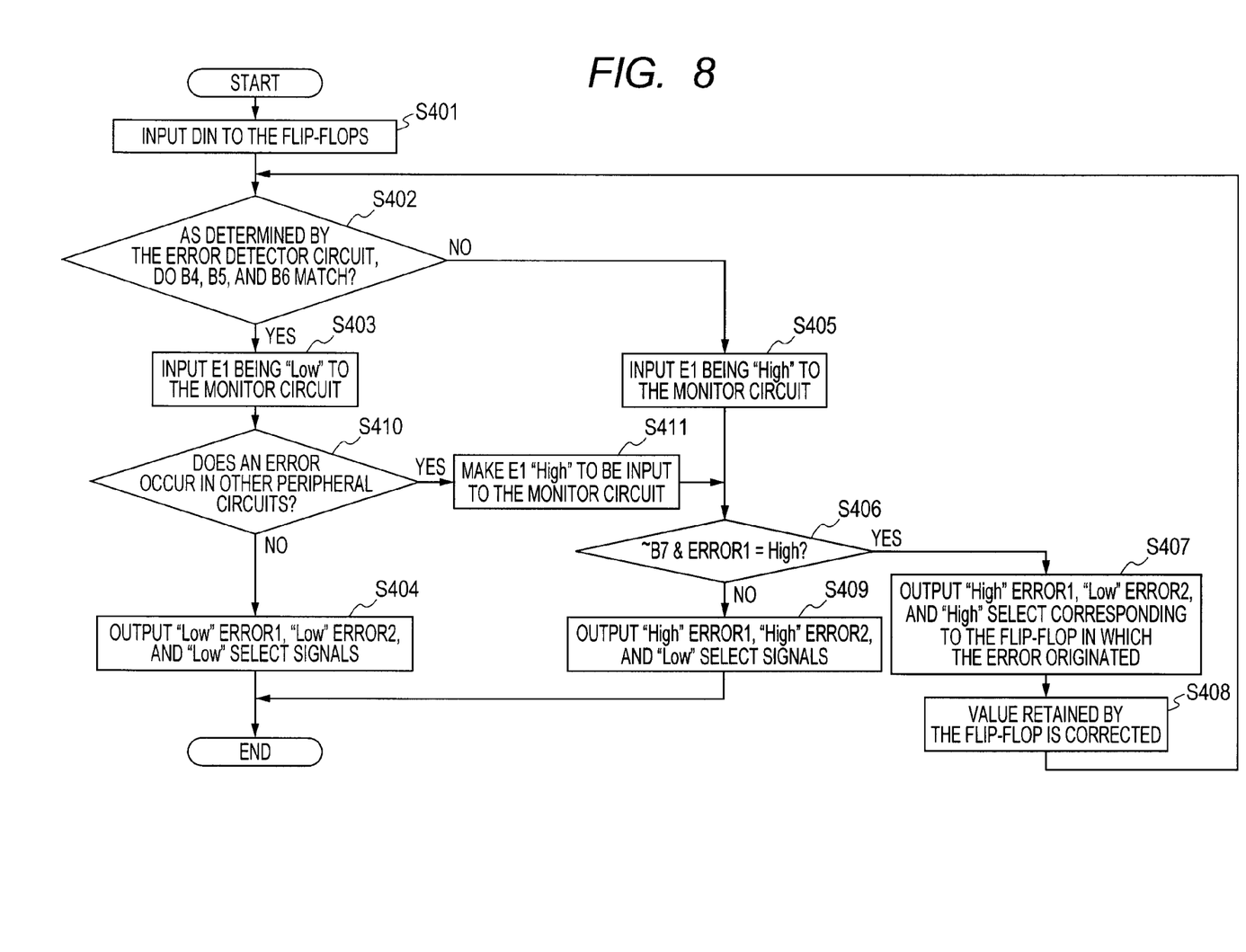
FIG. 8 is a flowchart describing a flow of an error detection method of the semiconductor integrated circuit pertaining to the second embodiment.

FIG. 8 is a flowchart describing a flow of an error detection method of the semiconductor integrated circuit pertaining to the second embodiment. In the flowchart shown in FIG. 8, a step S410 of determining whether or not an error occurs in other peripheral circuits and a step of making an error signal E1 "high" to be input to the monitor circuit 3 are newly added to the flowchart for the first embodiment shown in FIG. 4.

Specifically, after the input signal DIN is input to the three flip-flops F11, F12, F13, respectively, at step S401, the error detector circuit 2 determines whether or not the output signals B4, B5, B6 match at step S402. As a result of the determination, if the output signals B4, B5, B6 match, the error detector circuit 2 inputs an error signal E1 being "low" to the monitor circuit 3 at step S403.

In the present embodiment, after step S403, it is checked if one differs from others among the input signals to the majority circuits 7 in other peripheral circuits 5, 6 within the MCU (step S410). As a result of the determination in step S410, if no mismatch occurs among the signals which are input to the majority circuits 7 in other peripheral circuits within the MCU, a "No" determination is made. Then, step S404 is executed to send a notification that there is a match among the signals which are input to the majority circuits 7 in other peripheral circuits 5, 6.

As a result of the determination in step S410, if a mismatch occurs among the signals which are input to the majority circuits 7 in other peripheral circuits 5, 6 within the MCU, a "Yes" determination is made. Then, control is performed to make an error signal E1 "high" to be input to the monitor circuit 3 (step S411). By way of step S410 and step S411, it is possible to monitor if a mismatch occurs among the signals which are input to the majority circuits 7 for use in other peripheral circuits 5. After that, step S406 is performed. The flow of step S406 and subsequent is the same as in the first embodiment and, therefore, description thereof is omitted.

In this way, in the present embodiment, the monitor circuit 3 is capable of not only monitoring the outputs from the flip-flops F1, which are input to one majority circuit 7, but also monitoring the outputs from flip-flops, which are input to a plurality of majority circuits 7 at the same time. Moreover, it is possible to produce the same effect as the first embodiment.

The present invention is not limited to the above-described embodiments and may be modified, as appropriates, without departing from the spirit of the invention. For example, the foregoing first and second embodiments were described with regard to a case where a 3-bit majority circuit 7 is used which takes input of three output signals B4, B5, B6 which are output from three flip-flops F1; however, the number of flip-flops F1 is not limited to three. That is, the present invention can be applied for a majority circuit 7 that takes input of output signals from an odd number of flip-flops F1 more than 3. Although the flip-flops F1 are used as storage elements in the foregoing descriptions, other storage elements which are readable and writable, such as memories, may be used, of course.

What is claimed is:

1. A semiconductor integrated circuit comprising:
a first, a second and a third memory in synchronization with a clock;
a majority unit that receives a first, a second and a third value from the first, second and third memories respectively, and outputs a result of a majority vote of the first, the second and the third value; and
an error detector that receives the first, the second and the third value, from the first, second and third memories respectively, that detects a mismatch between any one of the first, second and third values and both of the others of the first, second and third values, and that outputs an error signal indicating the one of the first, second and third values which is different from both of the others of the first, second and third values,
wherein the value causing the mismatch, detected by the error detector, among the first, second and third values is replaced by the result of the majority vote output by the majority unit when the mismatch is detected by the error detector,
wherein the replacement is executed by supplying the result of the majority vote and the clock to the memory causing the mismatch among the first, second and third memories.

2. The semiconductor integrated circuit according to claim 1, wherein the semiconductor integrated circuit outputs a notification when the mismatch is still detected after the replacement.

3. The semiconductor integrated circuit according to claim 1, further comprising a central processing unit (CPU), wherein the replacement is executed independently from the CPU.

4. A method of a majority vote by a semiconductor integrated circuit (IC), the method comprising the steps of:
(a) receiving into a majority unit of the IC, a first, a second and a third value from a first, a second and a third memory, respectively, which are in synchronization with a clock, and generating via the majority unit a result of a majority vote of the first, the second and the third value;
(b) receiving into an error detector of the IC the first, the second and the third value, from the first, second and third memories respectively, detecting via the error detector a mismatch between any one of the first, second and third values and both of the others of the first, second and third values by the error detector, and outputting via the error detector an error signal indicating the one of the first, second and third values which is different from both of the others of the first, second and third values; and
(c) replacing the value causing the detected mismatch among the first, second and third values with the result of the majority vote output by the majority unit when the mismatch is detected by the error detector,
wherein the replacement is executed by supplying the result of the majority vote to the memory causing the mismatch among the first, second and third memories.

5. The method according to claim 4, further comprising:
(d) indicating a notification by the IC when the mismatch is still detected after the replacing.

* * * * *